(12) United States Patent
Han

(10) Patent No.: US 8,847,411 B2
(45) Date of Patent: Sep. 30, 2014

(54) SEMICONDUCTOR DEVICE AND METHOD OF MANUFACTURING THE SAME

(75) Inventor: Duk Sun Han, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/616,314

(22) Filed: Sep. 14, 2012

(65) Prior Publication Data

US 2013/0161839 A1    Jun. 27, 2013

(30) Foreign Application Priority Data

Dec. 21, 2011 (KR) .................... 10-2011-0139048

(51) Int. Cl.
| | |
|---|---|
| *H01L 29/40* | (2006.01) |
| *H01L 29/66* | (2006.01) |
| *H01L 23/48* | (2006.01) |
| *H01L 21/311* | (2006.01) |

(52) U.S. Cl.
USPC ............ 257/786; 257/330; 257/734; 438/702

(58) Field of Classification Search
CPC ................................................ H01L 21/0337
USPC ............ 257/786, E23.02; 438/765, 618, 637, 438/702
See application file for complete search history.

(56) References Cited

U.S. PATENT DOCUMENTS

| | | | | |
|---|---|---|---|---|
| 5,004,956 | A * | 4/1991 | Kun et al. .................... 345/76 |
| 6,323,097 | B1 * | 11/2001 | Wu et al. .................... 438/384 |
| 2007/0210449 | A1 * | 9/2007 | Caspary et al. ............... 257/734 |
| 2008/0261395 | A1 * | 10/2008 | Blawid et al. ................. 438/666 |
| 2010/0309708 | A1 * | 12/2010 | Sugimae et al. ............... 365/63 |
| 2012/0193705 | A1 * | 8/2012 | Lim et al. ..................... 257/330 |

* cited by examiner

*Primary Examiner* — Long K Tran
*Assistant Examiner* — Dzung Tran
(74) *Attorney, Agent, or Firm* — William Park & Associates Patent Ltd.

(57) ABSTRACT

A semiconductor device and a method of manufacturing the same are provided. The device includes first and second line pattern units configured to extend substantially parallel to one another in a first direction and alternately disposed such that end portions of the first and second line pattern units are arranged in a diagonal direction, third and fourth pattern units configured to respectively extend from the end portions of the first and second line pattern units in a second direction crossing the first direction, first contact pad units respectively formed in the third line pattern units disposed a first distance from the end portions of the first line pattern units, and fourth contact pad units respectively formed in the fourth line pattern units disposed a second distance from the end portions of the second line pattern units. Here, the second distance is different from the first distance.

14 Claims, 15 Drawing Sheets

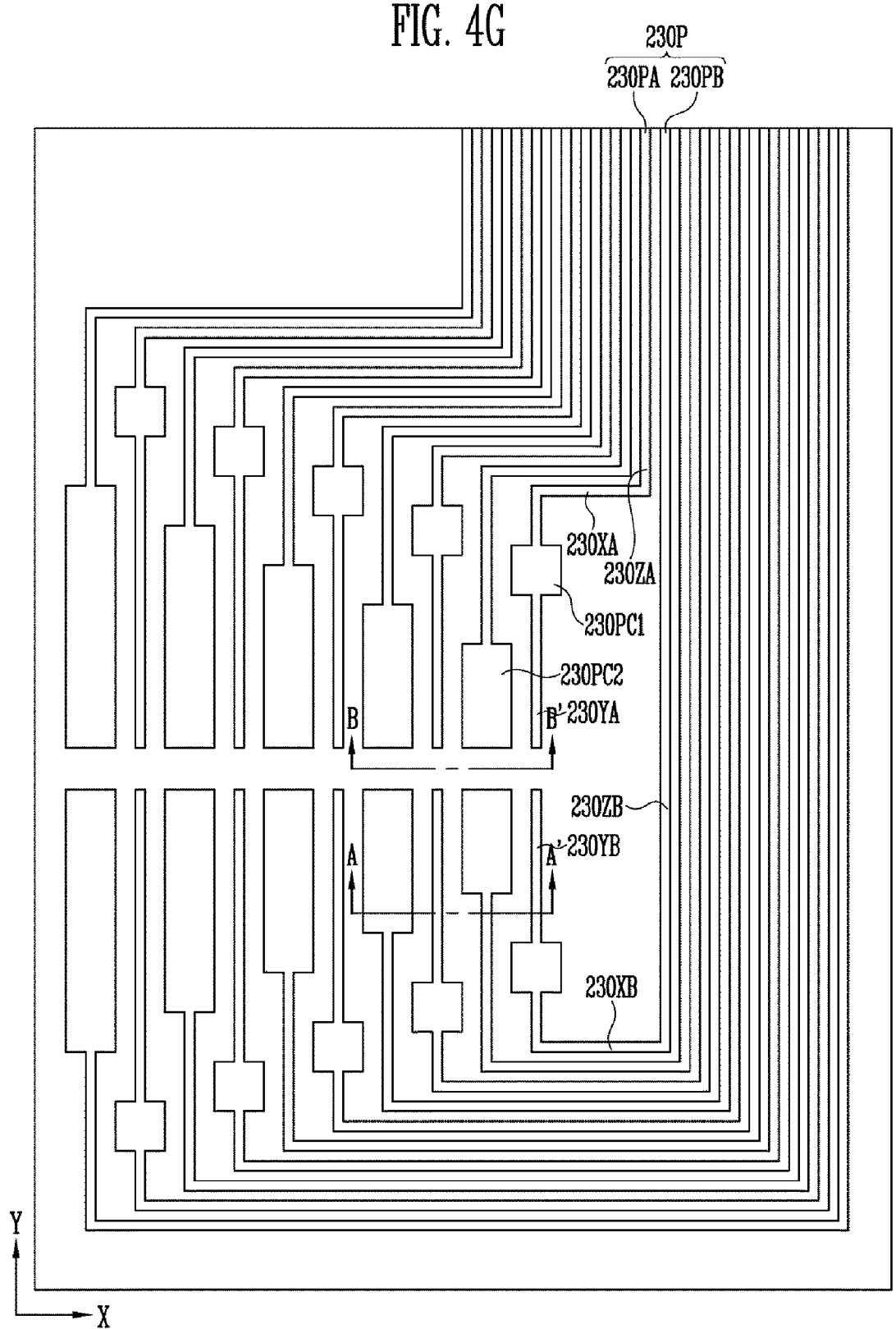

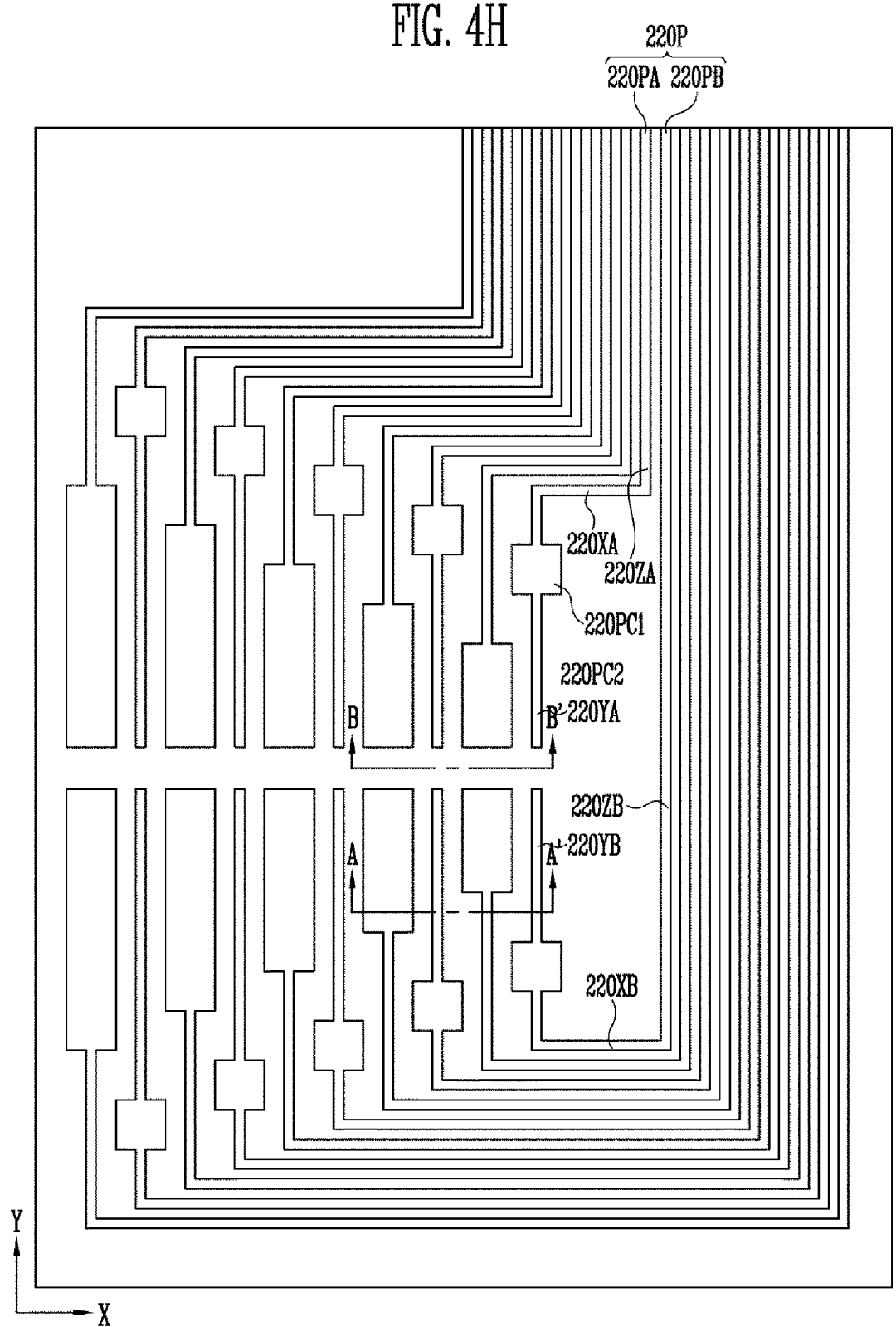

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2011-0139048, filed on Dec. 21, 2011, in the Korean Intellectual Property Office, the disclosure of which is incorporated herein by reference in its entirety.

BACKGROUND

1. Field of the Invention

The present invention relates to a semiconductor device and a method of manufacturing the same. More specifically, the present invention relates to a semiconductor device including a main pattern and a method of manufacturing the same.

2. Description of the Related Art

In recent years, as semiconductor devices have become downscaled and highly integrated, in order to form a larger number of patterns within a limited region, it has become necessary to reduce a line width and space width of patterns. Although conventional patterns are typically formed using a photolithography process, the photolithography process has a specific limit to reducing the line width and space width of patterns due to a resolution limit.

Accordingly, to form fine patterns having minute widths beyond the resolution limit of a photolithography process, a double pattern technique of doubly overlapping patterns to form fine patterns and a spacer patterning technique of forming fine patterns using spacers have been proposed.

A semiconductor device includes a plurality of metal interconnections and a plurality of contact pads connected to the plurality of metal interconnections. Accordingly, a layout for efficiently disposing the plurality of metal interconnections and the plurality of contact pads within a narrow area is needed.

SUMMARY OF THE INVENTION

The present invention is directed to a semiconductor device and a method of manufacturing the same, by which a plurality of fine patterns and a plurality of contact pads may be efficiently disposed.

One aspect of the present invention provides a semiconductor device including: a first main pattern including a first line pattern unit configured to extend in a first direction, a third line pattern unit configured to extend from an end portion of the first line pattern unit in a second direction crossing the first direction, and a first contact pad unit formed in the third line pattern unit disposed a first distance from the end portion of the first line pattern unit, and a second main pattern including a second line pattern unit configured to extend in the first direction and having a greater length than the first line pattern unit, a fourth line pattern unit configured to extend from an end portion of the second line pattern unit in the second direction, and a second contact pad unit formed in the fourth line pattern unit disposed a second distance from the end unit of the second line pattern unit, wherein the second distance is different from the first distance.

Another aspect of the present invention provides a semiconductor device including: first and second line pattern units configured to extend substantially parallel to one another in a first direction and alternately disposed such that end portions of the first and second line pattern units are arranged in a diagonal direction, third and fourth pattern units configured to respectively extend from the end portions of the first and second line pattern units in a second direction crossing the first direction, first contact pad units respectively formed in the third line pattern units disposed a first distance from the end portions of the first line pattern units, and fourth contact pad units respectively formed in the fourth line pattern units disposed a second distance from the end portions of the second line pattern units, wherein the second distance is different from the first distance.

Still another aspect of the present invention provides a method of manufacturing a semiconductor device, including: forming an etched layer on a semiconductor substrate, forming a first hard mask pattern including first-directional line pattern units disposed on the etched layer substantially parallel to one another, second-directional line pattern units configured to respectively extend from end portions of the first-directional line pattern units substantially parallel to one another, and contact pad units alternately disposed in the second-directional line pattern units disposed different distances from the end portions of the first-directional line pattern units, and etching the etched layer by performing an etching process using the first hard mask pattern as an etch mask to form a main pattern.

BRIEF DESCRIPTION OF THE DRAWINGS

The above and other features and advantages of the present invention will become more apparent to those of ordinary skill in the art by reading the described example embodiments thereof with reference to the attached drawings in which:

FIGS. 4A through 4H are plan views illustrating a method of manufacturing a semiconductor device according to an example embodiment of the present invention.

DETAILED DESCRIPTION OF EMBODIMENTS

The present invention will be described more fully hereinafter with reference to the accompanying drawings, in which example embodiments of the invention are shown. This invention may, however, be embodied in different forms and should not be construed as limited to the embodiments set forth herein. Rather, these example embodiments are provided so that this disclosure conveys a scope of the present invention to one skilled in the art.

Figure 1:
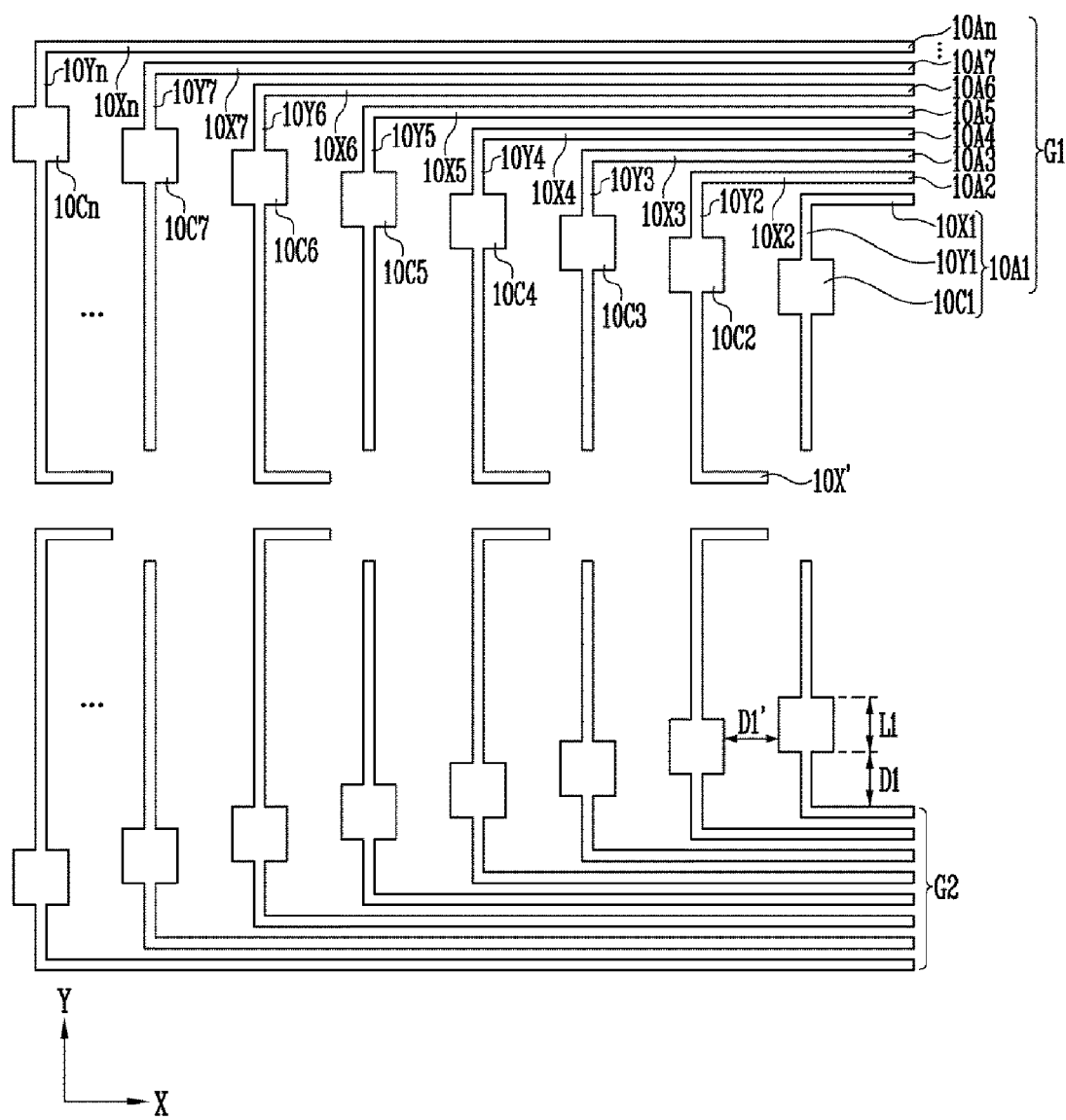
FIG. 1 is a plan view of fine patterns of a semiconductor device according to an example embodiment of the present invention.

FIG. 1 is a plan view of fine patterns of a semiconductor device according to an example embodiment of the present invention.

Referring to FIG. 1, a first main pattern group G1 including main patterns 10A1 to 10An may be formed using a plurality of deposition processes and a plurality of etching processes. A second main pattern group G2 may be also formed to be symmetric to the first main pattern group G1.

The main patterns 10A1 to 10An may be formed to be used as conductive lines. In particular, in a NAND flash memory device, the main patterns 10A1 to 10An may be used as interconnections connected to word lines or used as word lines.

A first main pattern 10A1 may include a first line pattern unit 10X1 extending in a first direction (or an X direction), a third line pattern unit 10Y1 extending from an end portion of the first line pattern unit 10X1 in a second direction (or a Y direction) crossing the first direction where the first direction and the second direction are substantially perpendicular, and a first contact pad unit 10C1 formed in the third line pattern unit 10Y1 disposed a first distance D1 from an end portion of the first line pattern unit 10X1 (i.e. wherein the end portion of the first line pattern unit 10X1 may be where a connection unit between the first and third line pattern units 10X1 and 10Y1). Although the reference characters D1, D1' and L1 appear in the second main pattern group G2, because the first main pattern group G1 and the second main pattern group G2 are symmetrical, the reference characters D1, D1' and L1 may correspond to symmetrically positioned components of the two main pattern groups G1 and G2. This also applies to the reference characters D2, D3, D4, S1 and L2 found in the embodiments depicted in FIGS. 2 and 3, as well as other reference characters found in the remaining figures.

A second main pattern 10A2 disposed adjacent to the first main pattern 10A1 may include a second line pattern unit 10X2 extending in the first direction and having a greater length than the first line pattern unit 10X1, a fourth line pattern unit 10Y2 extending from an end portion of the second line pattern unit 10X2 in the second direction, and a second contact pad unit 10C2 formed in the fourth line pattern unit 10Y2 disposed the first distance D1 from the end portion of the second line pattern unit 10X2 (i.e., wherein the end portion of the second line pattern unit 10X2 is where a connection unit between the second and fourth line pattern units 10X2 and 10Y2).

When the third and fourth line pattern units 10Y1 and 10Y2 are first formed, the third and fourth line pattern units 10Y1 and 10Y2 may be formed so that their end portions may be connected to each other. After the third and fourth line pattern units 10Y1 and 10Y2 are formed with end portions thereof connected to each other, the third and fourth line pattern units 10Y1 and 10Y2 may be removed using an etching process and separated from each other. As a result, another line pattern unit 10X' extending in the first direction may remain in the end portion of one (e.g., 10Y2) of the third and fourth line pattern units 10Y1 and 10Y2.

Here, the first and second main patterns 10A1 and 10A2 may form one pair, and several pairs of main patterns may be formed. To this end, line pattern units 10X1 to 10Xn may extend in the first direction parallel to one another and be disposed such that end portions of the line pattern units 10X1 to 10Xn are arranged in a diagonal direction. The line pattern units 10Y1 to 10Yn may extend from the end portions of the line pattern units 10X1 to 10Xn in the second direction, respectively. Contact pad units 10C1 to 10Cn may be formed in the line pattern units 10Y1 to 10Yn disposed a first distance D1 from the end portions of the line pattern units 10X1 to 10Xn, respectively. That is, when first formed, portions of the line pattern units 10Y1 to 10Yn, which may be disposed the first distance D1 from the end portions of the line pattern units 10X1 to 10Xn, may be formed to a greater width than the remaining portions thereof and become the contact pad units 10C1 to 10Cn. The contact pad units 10C1 to 10Cn may have the substantially same length L1. The first distance D1 and the first length L1 may be changed according to design rules.

Here, first line pattern units will be defined as odd first-directional line pattern units, second line pattern units will be defined as even first-directional line pattern units, third line pattern units odd will be defined as second-directional line pattern units, fourth line pattern units will be defined as even second-directional line pattern units, contact pads formed in the third line pattern units will be defined as first contact pads, and contact pads formed in the fourth line pattern units will be defined as second contact pads.

The line pattern units 10X1 to 10Xn may have gradually increasing lengths according to the order of disposition of the line pattern units 10X1 to 10Xn in the second direction. Thus, the end portions of the first-directional line patterns 10X1 to 10Xn may be arranged in a diagonal direction (XY direction). Accordingly, the contact pads 10C1 to 10Cn may also be arranged in the diagonal direction.

Contact plugs may be formed on the contact pads 10C1 to 10Cn. A minimum distance D1' between adjacent contact pads 10C1 to 10Cn may be maintained to prevent the adjacent contact pads 10C1 to 10Cn or contact plugs from being connected to one another. Thus, a distance between the second-directional line patterns 10Y1 to 10Yn may also increase.

Figure 2:
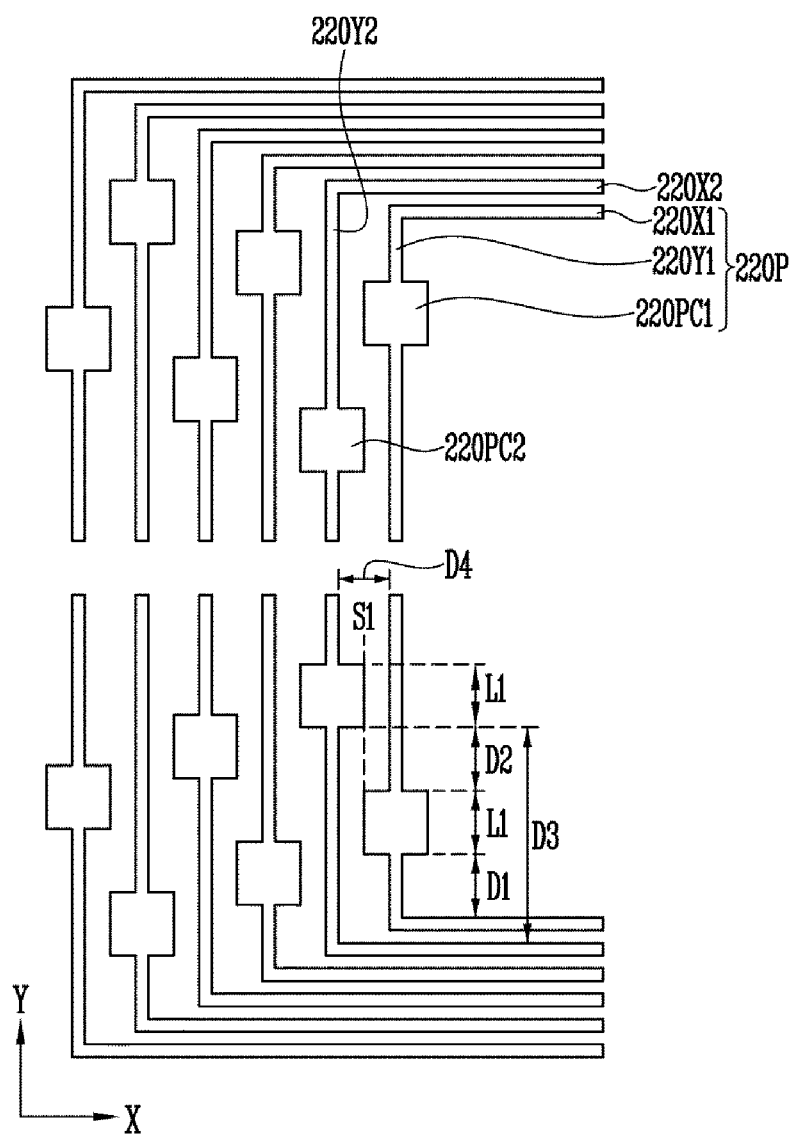
FIG. 2 is a plan view of fine patterns of a semiconductor device according to another example embodiment of the present invention.

FIG. 2 is a plan view of fine patterns of a semiconductor device according to another example embodiment of the present invention.

Referring to FIG. 2, line pattern units 220X1, 220X2, 220Y1, and 220Y2 may be formed in the substantially same shapes as the line pattern units shown in FIG. 1. Specifically, first-directional (or X-directional) line pattern units including first and second line pattern units 220X1 and 220X2 may extend in the first direction parallel to one another and be alternately disposed such that end portions of the first-directional line pattern units are arranged in a diagonal direction. Second-directional (or Y-directional) line pattern units including third and fourth line pattern units 220Y1 and 220Y2 may respectively extend from the end portions of the first-directional line pattern units 220X1 and 220X2 in the second direction. However, end portions of the second-directional line pattern units 220Y1 and 220Y2 may be aligned along the substantially same line along the first direction.

In particular, contact pad units including first and second contact pad units 220PC1 and 220PC2 may be arranged to zigzag with respect to the second-directional line pattern units 220Y1 and 220Y2 to increase integration density. The arrangement of the contact pads 220PC1 and 220PC2 will now be described in greater detail.

The first contact pad unit 220PC1 may be respectively formed in the third line pattern units 220Y1 disposed a first distance D1 from the first line pattern units 220X1. Thus, a first main pattern 220P including the first line pattern unit 220X1, the third line pattern unit 220Y1, and the first contact pad unit 220PC1 may be formed.

The second contact pad unit 220PC2 may be respectively formed in the fourth line pattern units 220Y2 disposed a second distance D3 from the second line pattern units 220X2. Here, the second distance D3 may be greater than the first distance D1. Thus, a second main pattern including the second line pattern 220X2, the fourth line pattern unit 220Y2, and the second contact pad unit 220PC2 may be formed.

The first distance D1 may correspond to a first length L1 of the first contact pad unit 220PC1. A second-directional distance D2 between the first contact pad unit 220PC1 and the second contact pad unit 220PC2 may correspond to the first distance D1. The second-directional distance D2 between the first contact pad unit 220PC1 and the second contact pad unit 220PC2 may correspond to the first length L1 of the first contact pad unit 220PC1.

In the present embodiment, the contact pad units 220PC1 and 220PC2 may be arranged to zigzag and/or stagger such that side surfaces of the contact pad units 220PC1 and 220PC2 do not face each other. Thus, a distance D4 between the second and fourth line pattern units 220Y1 and 220Y2 may be reduced such that opposite side surfaces of the first and second contact pad units 220PC1 and 220PC2 are disposed along the substantially same line. Accordingly, the integration density of the semiconductor device may be elevated.

In the embodiment depicted in FIG. 2, the contact pad units 220PC1 and 220PC2 are arranged to zigzag, thus a distance D4 between the second and fourth line pattern units 220Y1 and 220Y2 may be reduced.

Figure 3:
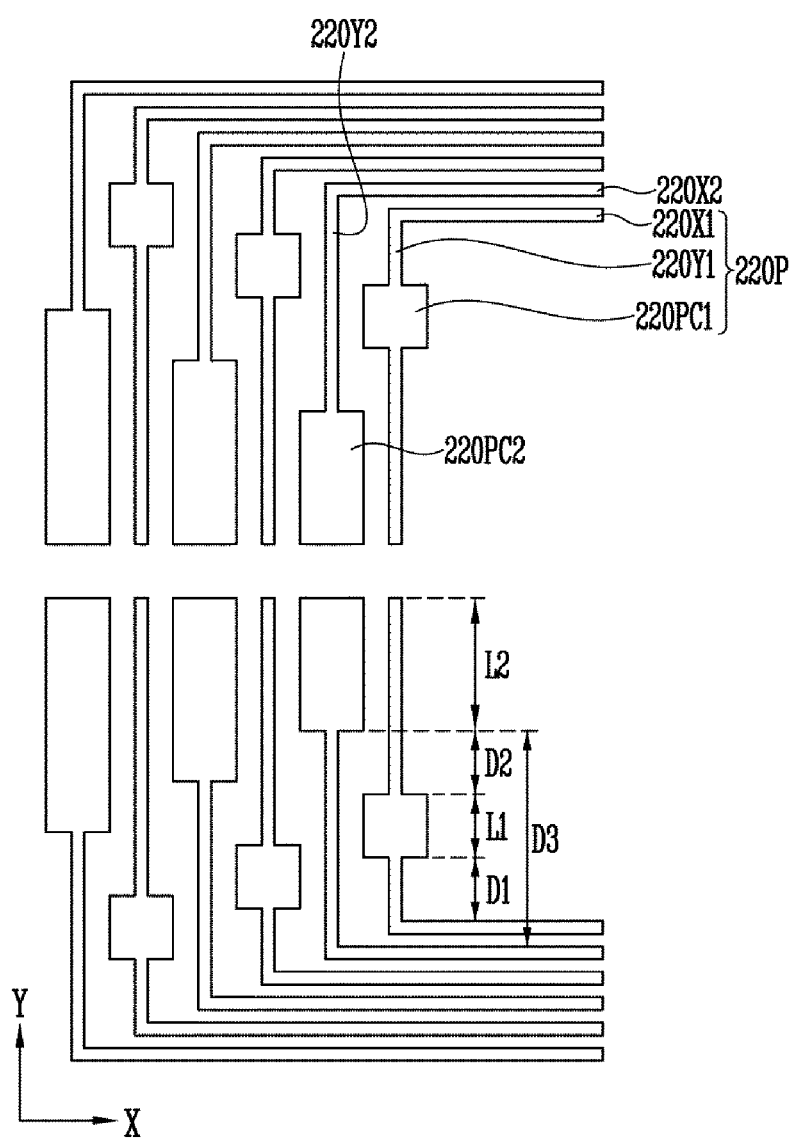
FIG. 3 is a plan view of fine patterns of a semiconductor device according to another example embodiment of the present invention.

FIG. 3 is a plan view of fine patterns of a semiconductor device according to another example embodiment of the present invention.

Referring to FIG. 3, first-directional line pattern units 220X1 and 220X2, second-directional line pattern units 220Y1 and 220Y2, and first contact pad units 220PC1 may be respectively formed in substantially the same shapes as the first-directional line pattern units 220X1 and 220X2, the second-directional line pattern units 220Y1 and 220Y2, and the first contact pad units 220PC1 shown in FIG. 2.

However, a length L2 of second contact pad units 220PC2 may be longer than a length L1 of the first contact pad units 220PC1. Also, the second contact pad units 220PC2 may be sequentially arranged to have gradually increasing lengths in the first direction. Thus, a length of the first contact pad unit 220PC1 disposed on one side of a third line pattern unit 220Y1 may be different from a length of the second contact pad unit 220PC2 disposed on adjacent side thereof. This is because all the second contact pad units 220PC2 extend from portions of the fourth line pattern units 220Y2 disposed substantially the same distance D3 from end portions of the second line pattern units 220X2 to end portions of the fourth line pattern units 220Y2, respectively. As a result, end portions of the second contact pad units 220PC2 may be disposed along the substantially same line as end portions of the third line pattern units 220Y1.

By increasing the lengths of the second contact pad units 220PC2 as described above, alignment margins may be ensured, and the stability of subsequent processes (e.g., prevention of voids) may be ensured.

Hereinafter, a method of manufacturing the semiconductor device shown in FIG. 3 will be described. In particular, to ensure the reliability and reproducibility of processes, contact pad units disposed in symmetrical positions may be formed to be connected to one another and then separated from one another using an etching process.

FIGS. 4A through 4H are plan views illustrating a method of manufacturing a semiconductor device according to an example embodiment of the present invention, and FIGS. 5A through 5H are cross-sectional views illustrating a method of manufacturing a semiconductor device according to an example embodiment of the present invention.

Figure 4A:
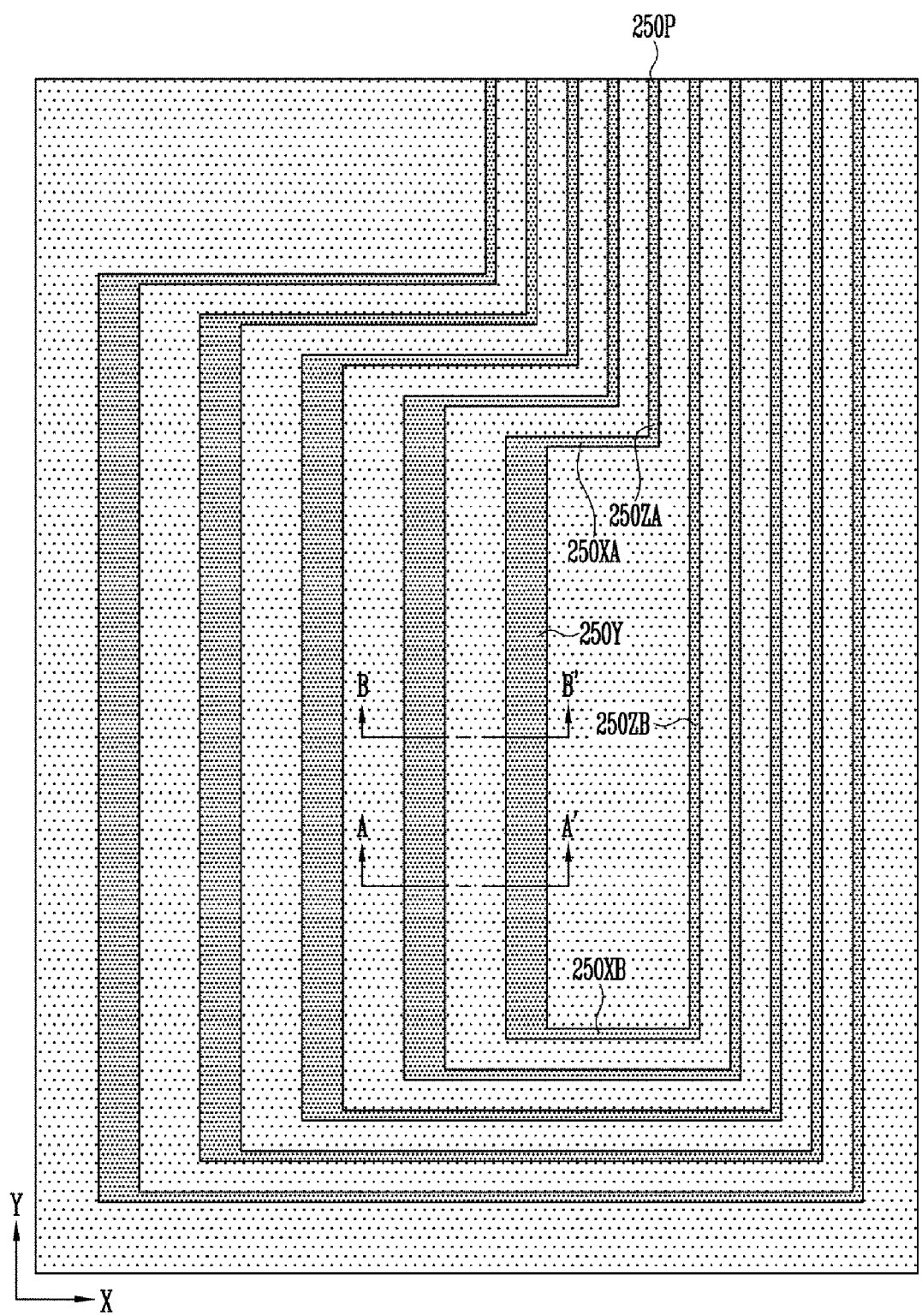
Figure 5A:
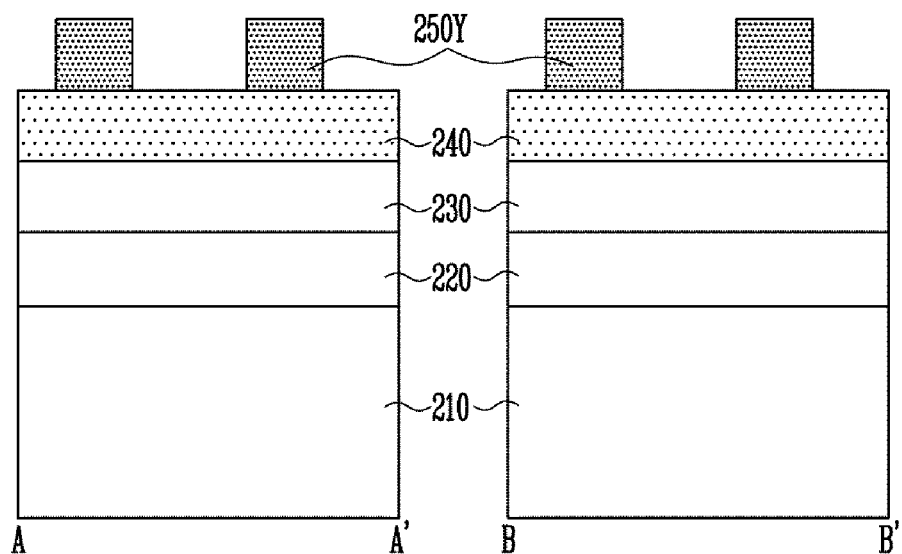
FIGS. 5A through 5H are cross-sectional views illustrating a method of manufacturing a semiconductor device according to an example embodiment of the present invention.

Referring to FIGS. 4A and 5A, an etched layer 220 may be formed on a semiconductor substrate 210. The etched layer 220 may be a polysilicon (poly-Si) layer, a metal layer, or a copper (Cu) layer to be used as an interconnection. Alternatively, the etched layer 220 may be formed by stacking a plurality of layers to be used as a gate line. First and second hard mask layers 230 and 240 may be sequentially formed on the etched layer 220, and a third hard mask layer may be deposited on the second hard mask layer 240 and patterned, thereby forming third hard mask patterns 250P. The first and second hard mask layers 230 and 240 and the third hard mask patterns 250P may be formed of materials having different etching characteristics so that the first and second hard mask layers 230 and 240 and the third hard mask patterns 250P may be etched using different etchants.

The third hard mask patterns 250P may include first-directional first line subsidiary pattern units 250XA and 250XB disposed substantially parallel to each other and second-directional second line subsidiary pattern units 250Y configured to connect one-side end portions of a pair of first-directional first line subsidiary pattern units 250XA and 250XB. Also, the third hard mask patterns 250P may further include first extension subsidiary patterns 250ZA and 250ZB extending from one-side end portions of the first-directional first line subsidiary pattern units 250XA and 250XB in the second direction. Here, the first extension subsidiary patterns 250ZA and 250ZB may extend from the one-side end portions of the first-directional first line subsidiary pattern units 250XA and 250XB to peripheral devices (e.g., a memory array including cell gates).

The second line subsidiary pattern units 250Y may be formed to a greater width than other pattern units 250XA, 250XB, 250ZA, and 250ZB. For reference, distances between and widths of the pattern units 250XA, 250XB, 250Y, 250ZA, and 250ZB may be determined in consideration of the fact that the distances between and widths of the pattern units 250XA, 250XB, 250Y, 250ZA, and 250ZB determine a distance between and width of spacers to be formed subsequently.

A plurality of third hard mask patterns 250P may be disposed such that third hard mask patterns with greater sizes surround third hard mask patterns with smaller sizes.

Figure 4B:
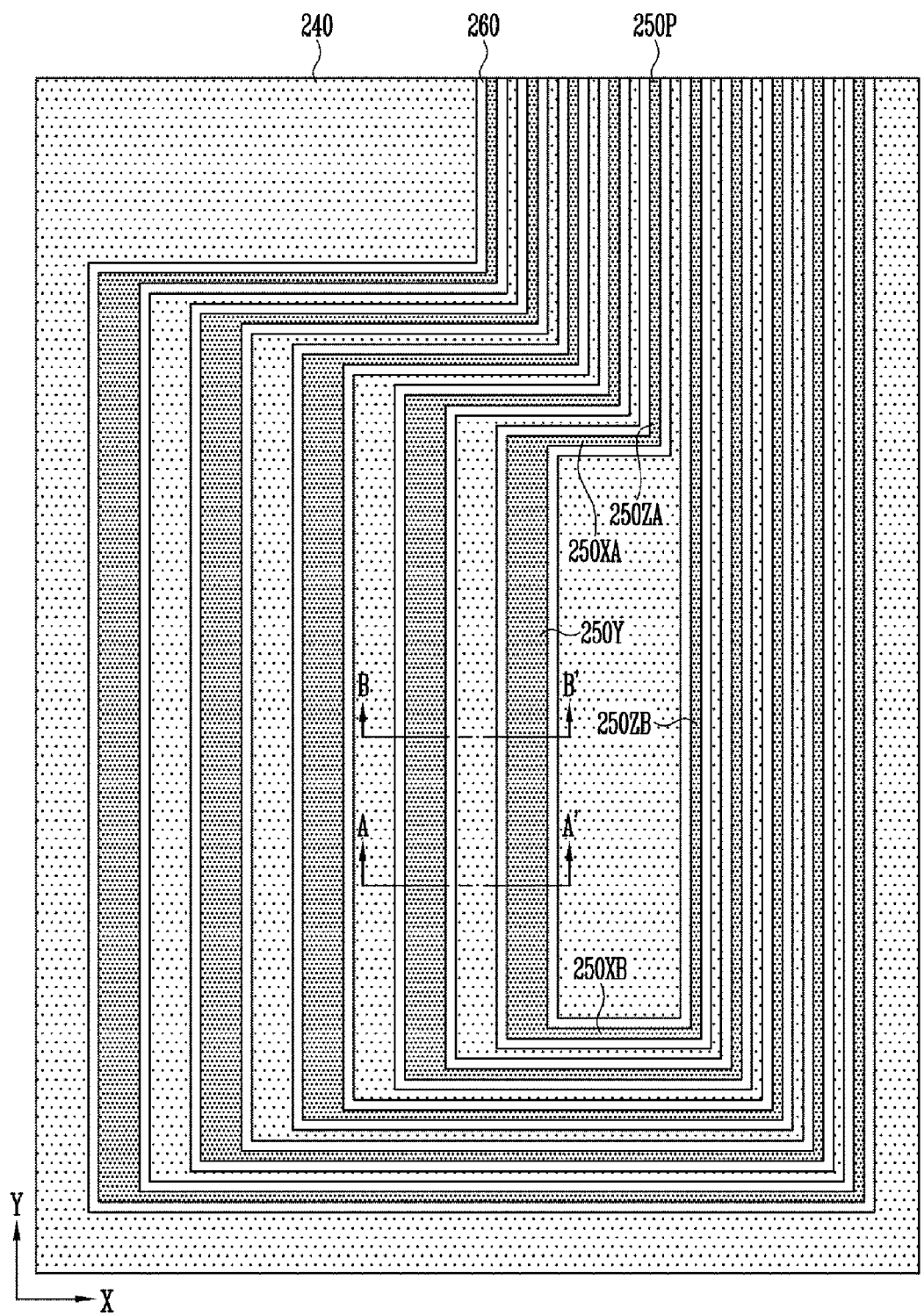
Figure 5B:
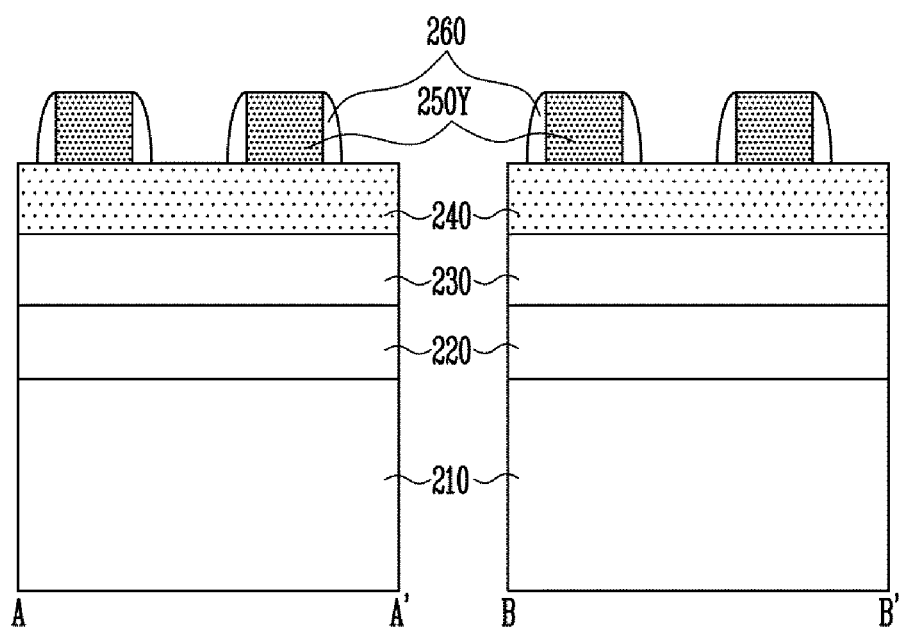

Referring to FIGS. 4B and 5B, spacers 260 may be formed to surround sidewalls of the third hard mask patterns 250P. The thickness of the spacers 260 may be determined in consideration of the fact that a distance between the spacers 260 depends on the thickness of the spacers 260 formed on the sidewalls of the third hard mask patterns 250P.

Figure 4C:
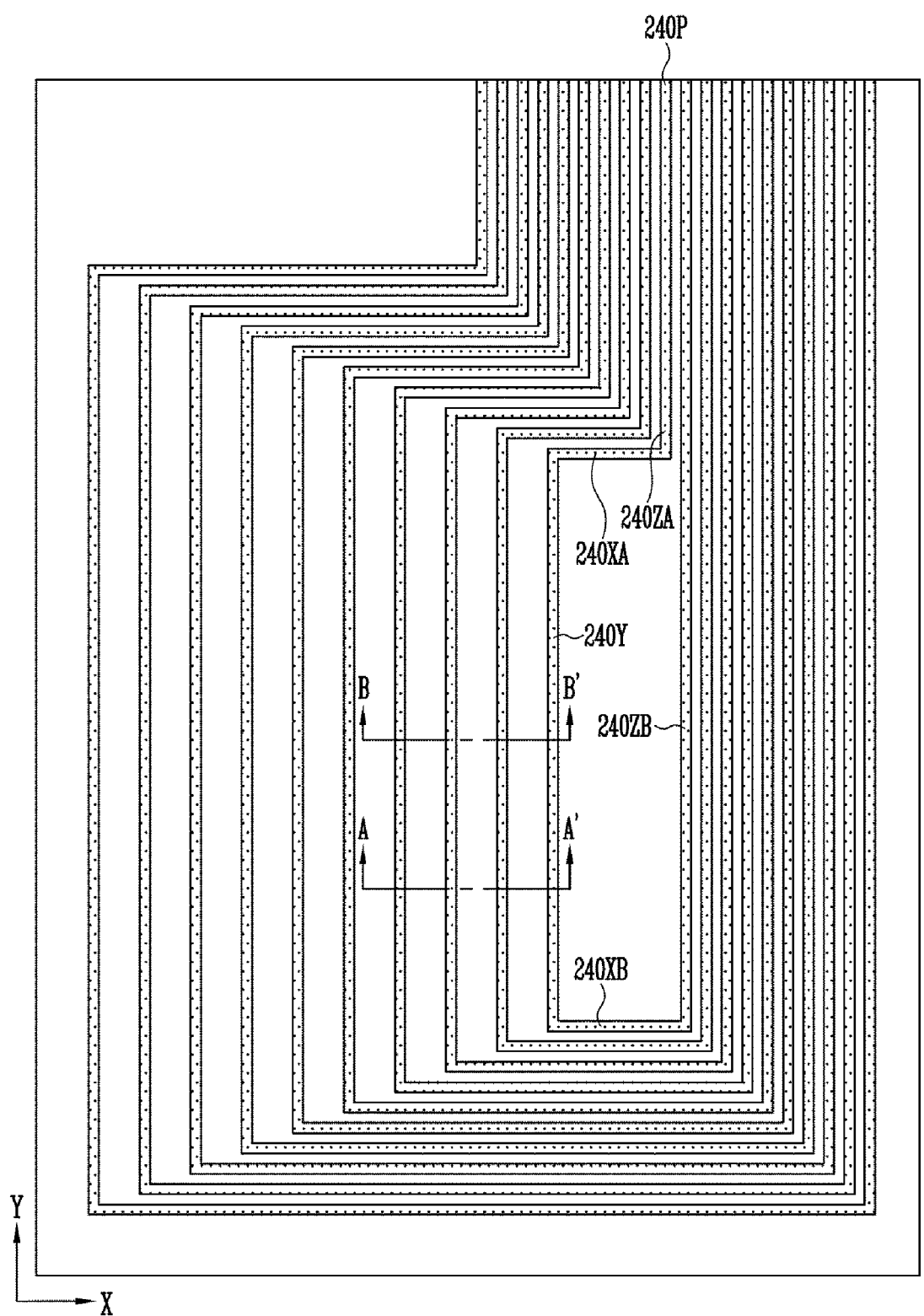
Figure 5C:
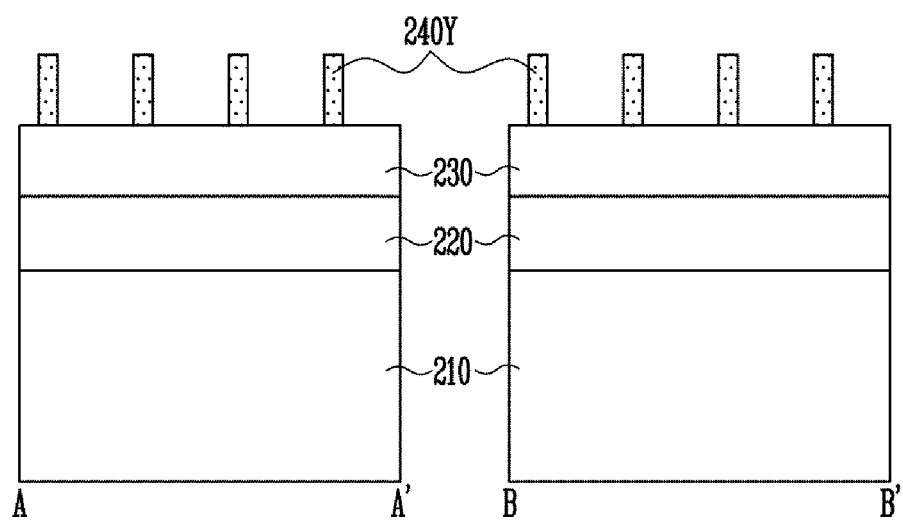

Referring to FIGS. 4C and 5C, the third hard mask patterns 250P may be removed. Also, the second hard mask layer 240 may be etched using the spacers 260 as an etch mask, thereby forming second hard mask patterns 240P. That is, a shape of the second hard mask patterns 240P may depend on a shape of the spacers 260.

The shape of the second hard mask patterns 240P may be similar to a shape of the third hard mask patterns 250P. That is, the second hard mask patterns 240P may include first-directional first line pattern units 240XA and 240XB disposed parallel to one another and second-directional second line pattern units 240Y configured to connect one-side end portions of a pair of first-directional first line pattern units 240XA and 240XB. Also, the second hard mask patterns 240P may further include extension patterns 240ZA and 240ZB extending from one-side end portions of the first-directional first line pattern units 240XA and 240XB in the second direction. Here, the extension patterns 240ZA and 240ZB may extend from the one-side end portions of the first-directional first line pattern units 240XA and 240XB to peripheral devices (e.g., a memory array including cell gates). However, all the pattern units 240XA, 240XB, 240Y, 240ZA, and 240ZB may have substantially the same width. Spaces between the second hard mask patterns 240P may correspond to regions from which the formed third hard mask patterns 250P are removed.

Furthermore, a plurality of second hard mask patterns 240P may be disposed such that second hard mask patterns with greater sizes surround second hard mask patterns with smaller sizes.

Figure 4D:
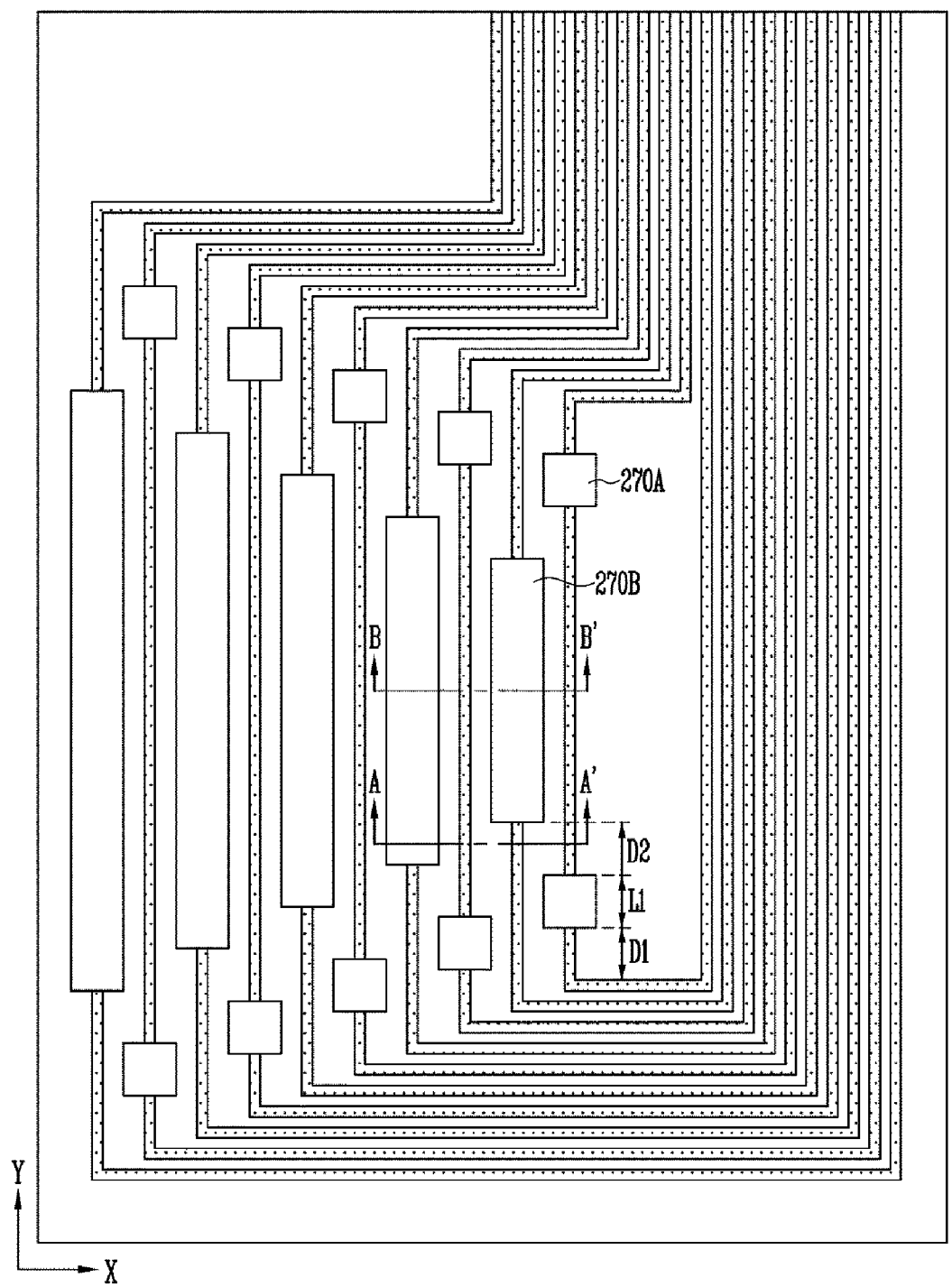
Figure 5D:
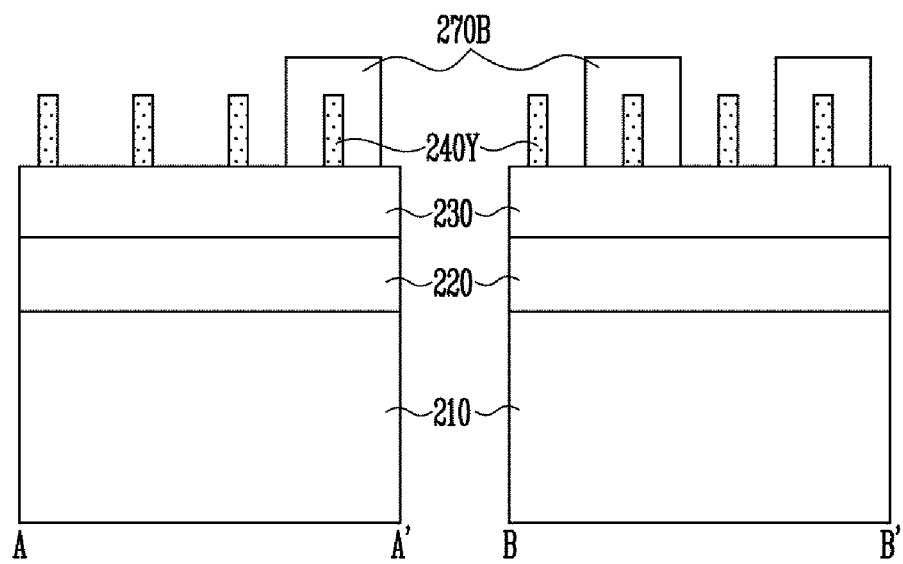

Referring to FIGS. 4D and 5D, first contact pad mask patterns 270A may be formed in odd second hard mask patterns 240P shown in FIG. 4C (which may be changed into even second hard mask patterns 240P) to cover both edges of the second-directional second line pattern units 240Y. Also, second contact pad mask patterns 270B may be formed in the even second hard mask patterns 240P (which may be changed into the odd second hard mask patterns 240P) to cover the centers of the second line pattern units 240Y.

Specifically, the first contact mask patterns 270A may be formed on tops and sidewalls of the second line pattern units 240Y disposed a first distance D1 from end portions of the first line pattern units 240XA and 240XB. The first contact mask patterns 270A may be formed in regions in which first contact pad units will be formed. Also, the second contact mask patterns 270B may be formed in regions in which second contact pad units will be formed and regions corresponding to spaces between the second contact pad units.

Figure 4E:
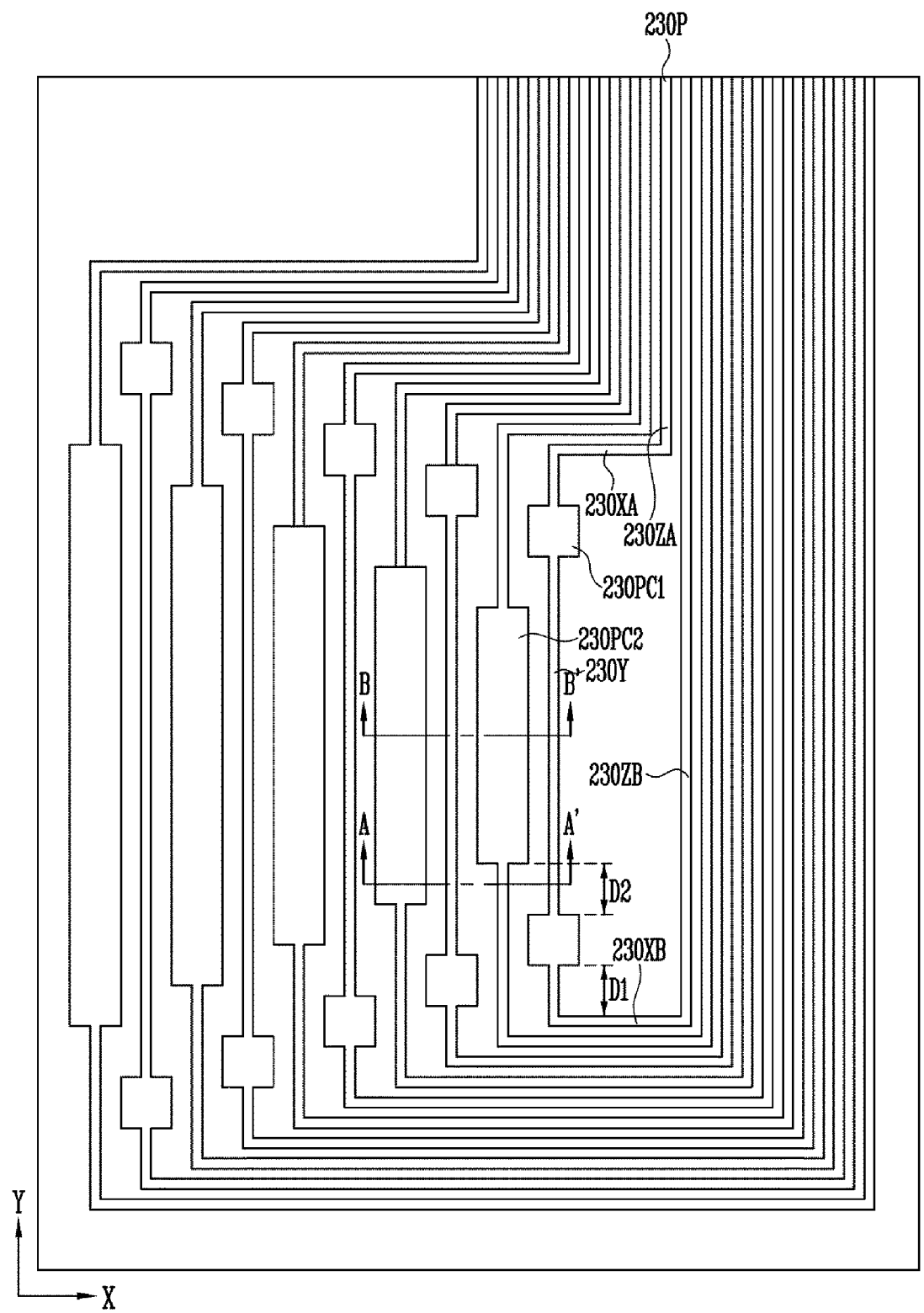
Figure 5E:
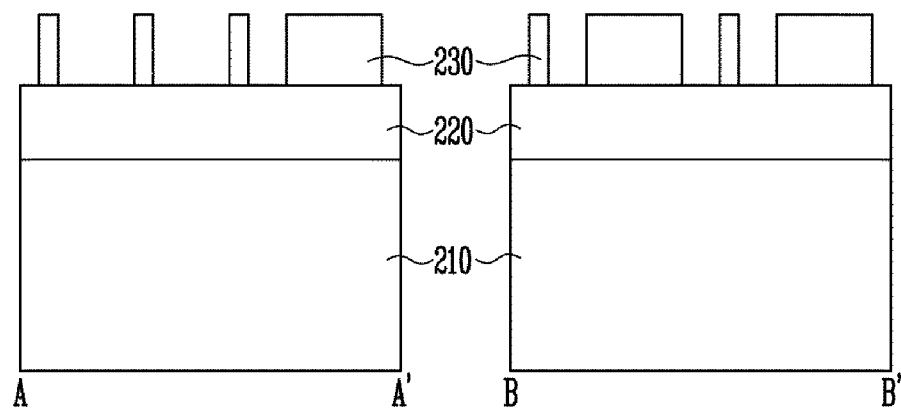

Referring to FIGS. 4E and 5E, the first hard mask layer 230 may be etched using the second hard mask patterns 240P as an etch mask, thereby forming first hard mask patterns 230P.

Like the second hard mask patterns 240P, the first hard mask patterns 230P may include first-directional first line pattern units 230XA and 230XB disposed substantially parallel to each other, and second-directional second line pattern units 230Y configured to connect one-side end portions of a pair of first-directional first line pattern units 230XA and 230XB. However, the first hard mask patterns 230P may further include first contact pad units 230PC1 and second contact pad units 230PC2.

The first contact pad units 230PC1 may be formed in both edges of odd second line pattern units 230Y (which may be changed into even second line pattern units 230Y). Specifically, the first contact pad units 230PC1 may be formed in the second line pattern units 230Y disposed the first distance D1 from the end portions of the first line pattern units 230XA and 230XB. The second contact pad units 230PC2 may be formed in the centers of the even second line pattern units 230Y (which may be changed into the odd second line pattern units 230Y). Specifically, the second contact pad units 230PC2 may be formed in regions of the second line pattern units 230Y disposed the first distance D1 from the first contact pad units 230PC1 in the first direction.

In particular, second contact pad units 230PC2 (arranged in the second direction) may have gradually increasing lengths when viewing the second the contact pad units 230PC2 from above from right to left in the first direction and have greater lengths than the first contact pad units 230PC1.

In addition, the first hard mask patterns 230P may further include extension patterns 230ZA and 230ZB extending from one-side end portions of the first-directional first line pattern units 230XA and 230XB in the second direction. Here, the extension patterns 230ZA and 230ZB may extend from the one-side end portions of the first-directional first line pattern units 230XA and 230XB to peripheral devices (e.g., a memory array including cell gates). However, although all the pattern units 230XA, 230XB, 230Y, 230ZA, and 230ZB have the substantially same width, the contact pad units 230PC1 and 230PC2 may be formed to greater widths than the pattern units 230XA, 230XB, 230Y, 230ZA, and 230ZB.

A plurality of first hard mask patterns 230P may be disposed such that first hard mask patterns with greater sizes surround first hard mask patterns with smaller sizes.

Figure 4F:
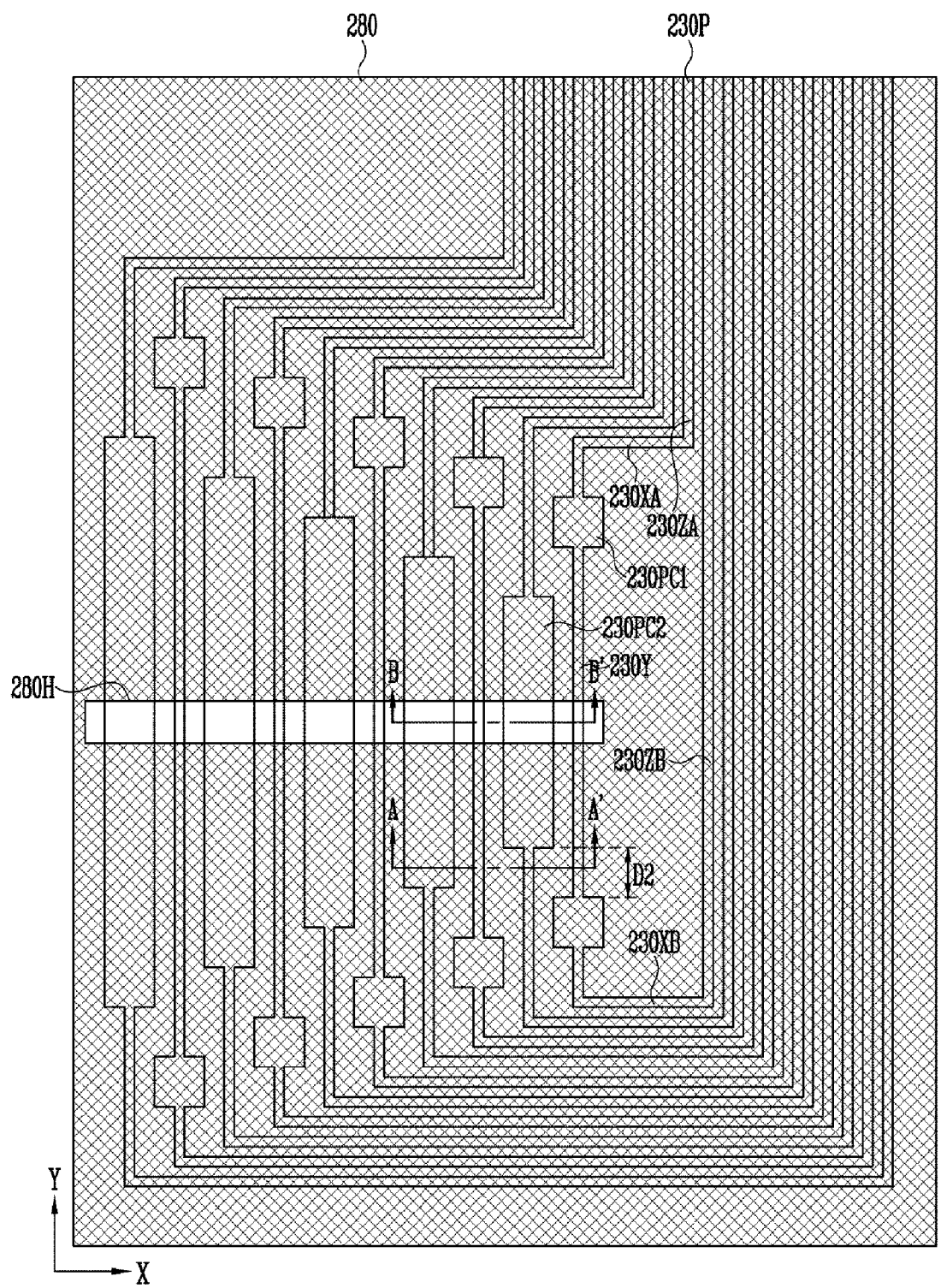
Figure 5F:
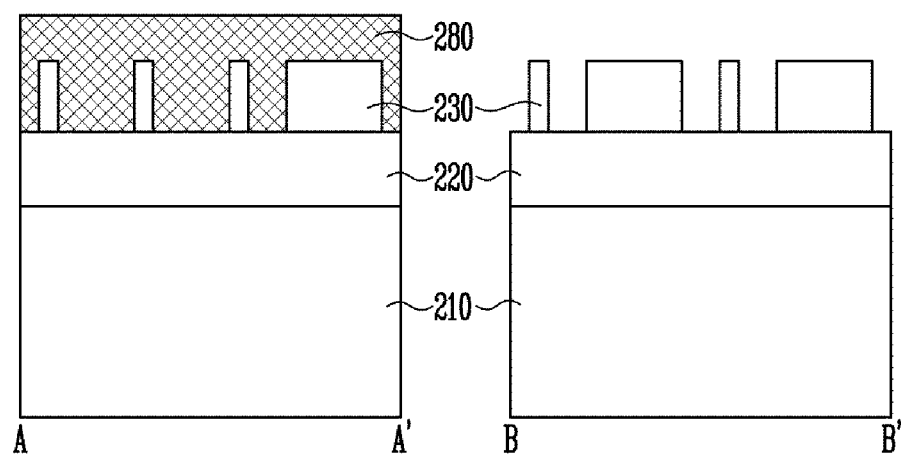

Referring to FIGS. 4F and 5F, an etch mask 280 may be formed to leave exposed the first hard mask patterns 230P in regions corresponding to spaces between the first contact pad mask patterns (refer to 270A in FIG. 4D) and regions corresponding to portions of the second contact mask patterns (refer to 270B in FIG. 4D). For example, the etch mask 280 may be formed to leave exposed the first hard mask patterns 230P in regions corresponding to the centers of the second line pattern units 230Y and regions corresponding to the centers of the second contact mask patterns 230PC2.

Figure 5G:
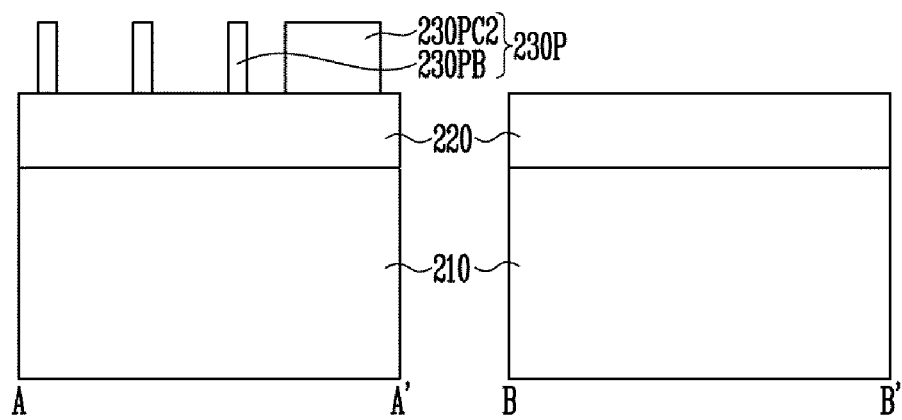
Figure 5H:
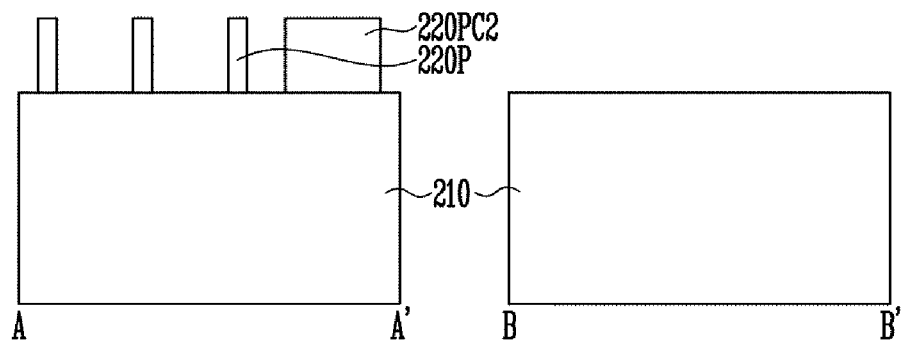

Referring to FIGS. 4G and 5G, the first hard mask patterns 230P remaining exposed in the regions corresponding to the centers of the second line pattern units 230Y (see FIG. 4F) and the regions corresponding to the centers of the second contact mask patterns 230PC2 may be etched using the etch mask 280. As a result, each of the second-directional line pattern units 230Y (see FIG. 4F) may be divided into two second-directional line pattern units 230YA and 230YB, and each of the second contact pad units 230PC2 may be divided into two contact pad units. That is, each of the first hard mask patterns 230P may be divided into two first hard mask patterns 230PA and 230PB.

The divided first hard mask pattern 230PA may include the first-directional line pattern unit 230XA, the line pattern unit 230YA extending from the end portion of the first-directional line pattern unit 230XA in the second direction, and the contact pad unit 230PC1 formed in the second-directional line pattern unit 230YA. Similarly, the other first hard mask pattern 230PB may include the first-directional line pattern unit 230XB, the line pattern unit 230YB extending from the end portion of the first-directional line pattern unit 230XB in the second direction, and the contact pad unit formed in the second-directional line pattern unit 230YB. Here, the patterns 230XA, 230YA, and 230PC1 may be formed in a symmetrical shape to the patterns 230XB, 230YB, and 230PC1. Also, the contact pad units 230PC2 may be formed in symmetrical shapes. The symmetrical patterns may be divided into a first group and a second group as shown in FIG. 1.

By separating the connected contact pad units 230PC2 using an etching process as described above, process reproducibility may be ensured.

Referring to FIGS. 4F and 5F, the etched layer 220 may be etched using the first hard mask patterns 230P as an etch mask, thereby forming main patterns 220P. As a result, the main patterns 220P may be formed to have a structure shown in FIG. 3.

According to the embodiments of the present invention, integration density can be improved by controlling the shapes and arrangement of main patterns.

In the drawings and specification, there have been disclosed typical example embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device comprising:
   a first main pattern including a first line pattern unit configured to extend in a first direction, a third line pattern unit configured to extend from an end portion of the first line pattern unit in a second direction crossing the first direction, and a first contact pad unit formed in the third line pattern unit disposed a first distance from the end portion of the first line pattern unit;
   a second main pattern including a second line pattern unit configured to extend in the first direction, a fourth line pattern unit configured to extend from an end portion of the second line pattern unit in the second direction, and a second contact pad unit formed in the fourth line pattern unit disposed a second distance from the end portion of the second line pattern unit; and a third main pattern including a fifth line pattern unit configured to extend in the first direction, a sixth line pattern unit configured to extend from an end portion of the fifth line pattern unit in the second direction, and a third contact pad unit formed in the sixth line pattern unit disposed a third distance from the end portion of the fifth line pattern unit, wherein the second distance is different from the first distance, and wherein the first contact pad unit, the second contact pad unit, and third contact pad unit are arranged to zigzag with respect to the third, fourth, and sixth line pattern units.

2. The semiconductor device of claim 1, wherein the first distance corresponds to a first length of the first contact pad unit.

3. The semiconductor device of claim 1, wherein a distance between the first and second contact pad units in the second direction corresponds to the first length of the first contact pad unit.

4. The semiconductor device of claim 1, wherein opposite side surfaces of the first and second contact pad units are disposed on a substantially same line.

5. The semiconductor device of claim 1, wherein a length of the second contact pad units is different from a length of the first contact pad units.

6. The semiconductor device of claim 1, wherein a length of the second contact pad unit disposed on one side of the third line pattern unit is different from a length of the second contact pad unit disposed on an other side thereof.

7. The device of any one of claim 1, wherein end portions of the second contact pad units are disposed on a substantially same line as end portions of the third line pattern units.

8. A semiconductor device comprising:

first and second line pattern units configured to extend substantially parallel to one another in a first direction and disposed such that end portions of the first and second line pattern units are arranged in a diagonal direction;

fifth line pattern units configured to extend substantially parallel to the first direction and disposed such that the end portions of the fifth line pattern units are arranged in a diagonal direction with the end portions of the first and second line pattern units;

third and fourth line pattern units configured to respectively extend from the end portions of the first and second line pattern units in a second direction crossing the first direction;

sixth line pattern units configured to extend from the end portions of the fifth line pattern units in the second direction crossing the first direction;

first contact pad units respectively formed in the third line pattern units disposed a first distance from the end portions of the first line pattern units;

second contact pad units respectively formed in the fourth line pattern units disposed a second distance from the end portions of the second line pattern units; and third contact pad units respectively formed in the sixth line pattern units disposed a third distance from the end portions of the fifth line pattern units, wherein the second distance is different from the first distance, and wherein the first contact pad units, the second contact pad units, and third contact pad units are arranged to zigzag with respect to the third, fourth, and sixth line pattern units.

9. The semiconductor device of claim 8, wherein the first distance corresponds to a first length of the first contact pad unit.

10. The semiconductor device of claim 8, wherein a distance between the first and second contact pad units in the second direction corresponds to a first length of the first contact pad unit.

11. The semiconductor device of claim 8, wherein opposite side surfaces of the first and second contact pad units are disposed on a substantially same line.

12. The semiconductor device of claim 8, wherein a length of the second contact pad units is different from a length of the first contact pad units.

13. The semiconductor device of claim 8, wherein a length of the second contact pad unit disposed on one side of the third line pattern unit is different from a length of the second contact pad unit disposed on an other side thereof.

14. The semiconductor device of claim 8, wherein end portions of the second contact pad units are disposed on a substantially same line as end portions of the third line pattern units.

* * * * *